United States Patent
Iwasaki et al.

(10) Patent No.: US 11,394,148 B2
(45) Date of Patent: Jul. 19, 2022

(54) CONTACT PROBE AND INSPECTION SOCKET PROVIDED WITH CONTACT PROBE

(71) Applicant: UNITECHNO Inc., Tokyo (JP)

(72) Inventors: Hidekazu Iwasaki, Tokyo (JP); Kazuaki Arai, Tokyo (JP)

(73) Assignee: UNITECHNO Inc., Tokyo (JP)

( * ) Notice: Subject to any disclaimer, the term of this patent is extended or adjusted under 35 U.S.C. 154(b) by 0 days.

(21) Appl. No.: 17/264,570

(22) PCT Filed: Aug. 2, 2018

(86) PCT No.: PCT/JP2018/029019
§ 371 (c)(1),
(2) Date: Jan. 29, 2021

(87) PCT Pub. No.: WO2020/026409
PCT Pub. Date: Feb. 6, 2020

(65) Prior Publication Data
US 2021/0336365 A1    Oct. 28, 2021

(51) Int. Cl.
*H01R 13/17* (2006.01)
*H01R 13/24* (2006.01)

(52) U.S. Cl.
CPC ......... *H01R 13/17* (2013.01); *H01R 13/2471* (2013.01); *H01R 13/2492* (2013.01); *H01R 2201/20* (2013.01)

(58) Field of Classification Search
CPC ................ H01R 13/17; H01R 13/2471; H01R 13/2492; H01R 2201/20; H01R 11/18;
(Continued)

(56) References Cited

U.S. PATENT DOCUMENTS

2016/0216294 A1*    7/2016    Kaashoek .......... G01R 1/06722

FOREIGN PATENT DOCUMENTS

JP    2010-256251 A    11/2010
JP    2012-181096 A    9/2012
(Continued)

OTHER PUBLICATIONS

International Search Report for International Patent Application No. PCT/JP2018/029019, dated Oct. 30, 2018 in 5 pages including English translation.

*Primary Examiner* — Travis S Chambers
(74) *Attorney, Agent, or Firm* — Knobbe, Martens, Olson & Bear, LLP

(57) ABSTRACT

A contact probe can be easily mass-produced, reduce manufacturing cost, and obtain a stable contact state with an electrode such as a land of an inspection substrate. An inspection socket can be provided with the contact probe. The contact probe has a first contact terminal that contacts a solder ball of a device under test and a second contact terminal that contacts a land of a printed substrate, and a coil spring for urging contact terminals so as to separate the first and the second terminals. The first contact terminal is constituted by a first contact element formed by a rod-shaped metal member, and the second contact terminal is constituted by two second contact elements formed by a plate-shaped metal member and which clamp the first contact element in frictional contact with a part of the first contact element.

14 Claims, 12 Drawing Sheets

(58) Field of Classification Search
CPC ............ H01R 13/2421; H01R 13/2428; H01R 13/2464; H01R 13/2485; G01R 3/00; G01R 1/06722
See application file for complete search history.

(56) References Cited

FOREIGN PATENT DOCUMENTS

| | | | | |
|---|---|---|---|---|
| JP | 2013217800 A | * | 10/2013 | ......... G01R 1/06716 |
| JP | 2016-75709 A | | 5/2016 | |
| WO | 2011/036935 A1 | | 3/2011 | |
| WO | WO-2015037696 A1 | * | 3/2015 | ......... G01R 1/06722 |
| WO | 2017/141564 A1 | | 8/2017 | |

* cited by examiner

FIG.4A
FIG.4B
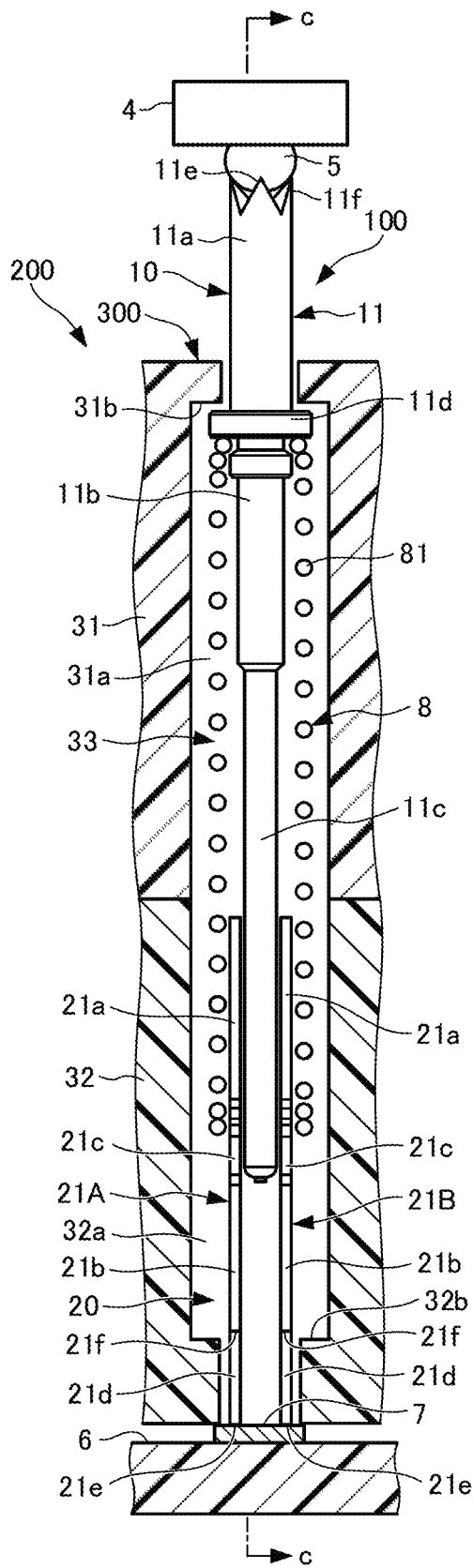
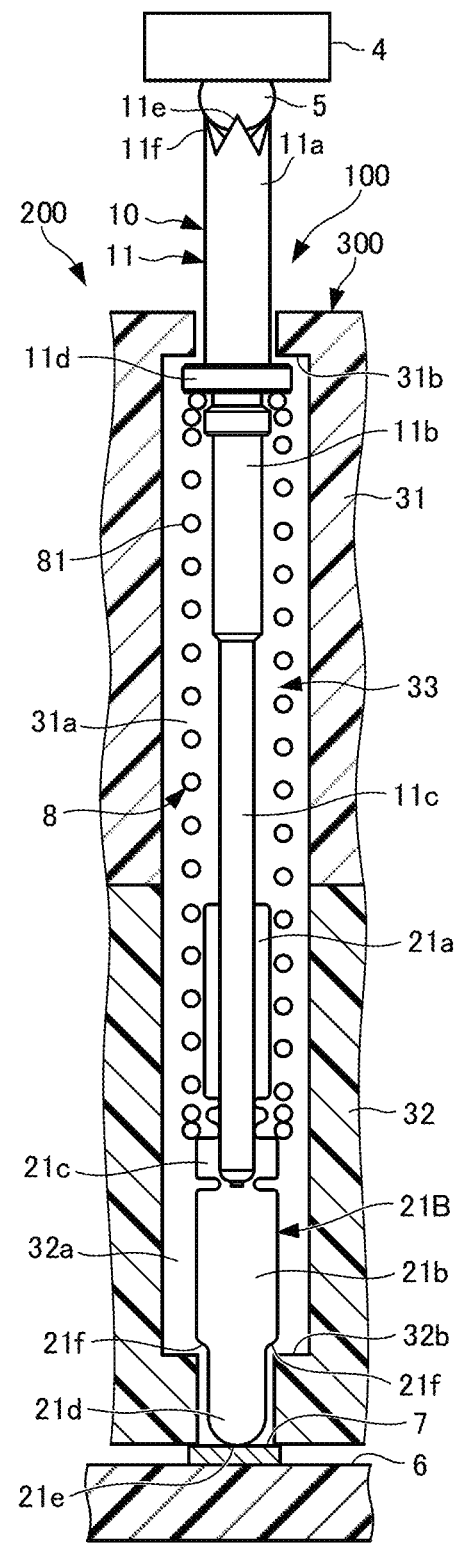

CONTACT PROBE AND INSPECTION SOCKET PROVIDED WITH CONTACT PROBE

CROSS-REFERENCE TO RELATED APPLICATIONS

This application is the U.S. National Phase under 35. U.S.C. § 371 of International Application PCT/JP2018/029019, filed Aug. 2, 2018, the disclosure of which including the specification, the drawings, and the claims is hereby incorporated by reference in its entirety.

FIELD OF THE INVENTION

The present invention relates to a contact probe and an inspection socket provided with the contact probe.

BACKGROUND ART

When inspecting the electrical characteristics of an inspected object such as a semiconductor integrated circuit, a contact probe is used to electrically connect the inspected object and the inspection substrate on the measuring device side. This type of contact probe provided with a first contact terminal that contacts an electrode provided on the inspected object, a second contact terminal that contacts a land provided on the inspection substrate, and an elastic body that engages with the first contact terminal and the second contact terminal and urges the first contact terminal and the second contact terminal so as to separate the first and the second terminals. Further, there is known a contact probe provided with a first contact terminal having a cylindrical portion and a second contact terminal having a cylindrical portion with a hole formed therein, wherein the cylindrical portion of the first contact terminal is inserted in the hole of the cylindrical portion of the second contact terminal (See, for example, Patent Document 1).

PATENT DOCUMENT

[Patent Document 1] Japanese Patent Application Publication No. 2010-256251

SUMMARY OF INVENTION

Technical Problems

In the contact probe described in Patent Document 1, it is essential that the hole formed in the cylindrical portion of the second contact terminal has a high accuracy in the inner diameter and coaxiality, and a high smoothness on the inner peripheral surface. Therefore, when such a hole is formed by cutting, the machining time becomes long, which leads to the problems that mass productivity decreases and manufacturing cost increases. Further, since the contact probe described in Patent Document 1 has only one contact portion of the second contact terminal that contacts the land of the inspection substrate, the contact state may become unstable, if, for example, an insulating foreign matter is caught between the contact portion and the land of the inspection substrate.

Therefore, tit is the object of the present invention to provide a contact probe that can be easily mass-produced and can reduce the manufacturing cost, while being able to obtain a stable contact state with an electrode such as a land of an inspection substrate, and an inspection socket provided with the same.

Means to Solve the Problems

The contact probe according to the present invention is (1) a contact probe to electrically connect a first electrode and a second electrode, the contact probe comprising: a first contact terminal that contacts the first electrode; a second contact terminal that contacts the second electrode; and an elastic body that engages the first contact terminal and the second contact terminal, and urges the first contact terminal and the second contact terminal so as to separate the first and the second terminals, wherein the first contact terminal is constituted by a first contact element, that is formed by a rod-shaped metal member and provided with a first contact portion that contacts with the first electrode, the second contact terminal is constituted by a plurality of second contact elements, that are formed by a plate-shaped metal member, provided with a second contact portion that contacts with the second electrode, and clamp the first contact element in a frictional contact with a part of the first contact element, the first contact element and the second contact element can move so as to be frictionally contacting each other while being relatively close to and spaced apart from the first electrode and the second electrode, and the elastic body is constituted by a coil spring provided so as to surround at least a part of the first contact element and the second contact element, to elastically press the first contact portion of the first contact element against the first electrode, and to elastically press the second contact portion of the second contact element against the second electrode.

By this configuration, the contact probe according to the present invention includes the second contact terminal, which is formed by a plate-shaped metal member and is constituted by a plurality of second contact elements that clamp the first contact element of the first contact terminal, so that when manufacturing the second contact element, drilling is not required unlike the conventional second contact terminal having a cylindrical portion. Therefore, the contact probe according to the present invention can be easily manufactured using processing technologies, for example, press processing, etching processing and the like with a relatively low manufacturing cost, and as a result that, the contact probe according to the present invention can be easily mass-produced and the manufacturing cost can be reduced. Further, since the second contact terminal of the contact probe according to the present invention has a plurality of second contact elements, the second contact terminal has a plurality of second contact portions that come into contact with electrodes such as lands of the inspection substrate. Therefore, even if one second contact portion comes into contact with the second electrode in an unstable state, the contact probe according to the present invention can surely bring the other second contact portion into contact with the second electrode, thereby making it possible to obtain a stable contact state with the second electrode.

In the contact probe according to the present invention, (2) each of the second contact elements of the second contact terminal is formed by a flat metal plate.

By this configuration, in the contact probe according to the present invention, since the second contact element constituting the second contact terminal is formed by a flat metal plate, when manufacturing the second contact element, drilling is not required unlike the conventional second contact terminal having a cylindrical portion. Therefore, the contact probe according to the present invention can be easily manufactured using processing technologies, for example, press processing, etching processing and the like with a relatively low manufacturing cost, and as a result, the contact probe according to the present invention can be easily mass-produced and the manufacturing cost can be reduced.

In the contact probe according to the present invention, (3) the second contact terminal is constituted by two second contact elements arranged to clamp the first contact element.

By this configuration, the second contact terminal is formed by the two second contact elements, so that the second contact terminal has a simple structure, and therefore, the contact probe according to the present invention can be easily mass-produced, and the manufacturing cost can be reduced.

In the contact probe according to the present invention, (4) the second contact terminal is constituted by three or more second contact elements arranged to surround and clamp the first contact element.

By this configuration, the contact probe according to the present invention has a configuration in which the first contact element is surrounded and clamped by three or more second contact elements constituting the second contact terminal, so that the first contact element can be reliably and stably supported in a predetermined position without causing blurring.

In the contact probe according to the present invention, (5) each of the second contact elements of the second contact terminal has an inner surface concave cross-sectional shape, and the second contact terminal is constituted by a plurality of the second contact elements arranged to surround and clamp the first contact element.

By this configuration, the contact probe according to the present invention has a configuration in which the first contact element is surrounded and clamped by a plurality of second contact elements having a concave cross-sectional shape on the inner surface, so that the first contact element can be reliably and stably supported in a predetermined position without causing blurring.

In the contact probe according to the present invention, (6) the coil spring has a closely wound portion in which a wire rod is wound in close contact and a sparsely wound portion in which the wire rod has a coarser pitch than and is wound apart compared to the closely wound portion, and the closely wound portion is provided so as to surround a portion that clamps the first contact element by the plurality of the second contact elements.

By this configuration, in the contact probe according to the present invention, the closely wound portion having stronger elasticity than the sparsely wound portion in the coil spring surrounds the portion where the first contact element is clamped by the plurality of second contact elements, so that the second contact element is less likely to be separated from the first contact element, thereby making it possible to obtain a reliable frictional contact state between the first contact element and the second contact element, and inclination of the first contact element can be suppressed by the closely wound portion.

The inspection socket according to the present invention is (7) provided with the above-described contact probe, and a housing in which an accommodation portion that accommodates the contact probe is formed.

By this configuration, the inspection socket according to the present invention can be easily mass-produced, so that the manufacturing cost can be reduced, thereby making it possible to provide an inspection socket provided with a contact probe that can obtain a stable contact state with respect to an electrode such as a land of an inspection substrate.

Effect of the Invention

According to the present invention, it is possible to provide a contact probe that can be easily mass-produced and can reduce the manufacturing cost, while being able to obtain a stable contact state with an electrode such as a land of an inspection substrate, and an inspection socket provided with the same.

BRIEF DESCRIPTION OF THE DRAWINGS

FIGS. 1A and 1B are views illustrating a first embodiment of an inspection socket provided with a contact probe according to the present invention, in which FIG. 1A is a vertical sectional view thereof, and FIG. 1B is a cross-sectional view taken along b-b in FIG. 1A.

FIGS. 4A and 4B are views illustrating a usage state of an inspection socket according to the first embodiment of the present invention, in which FIG. 4A is a vertical sectional view of the inspection socket, and FIG. 4B is a cross sectional view taken along c-c in FIG. 4A.

FIGS. 7A and 7B are views illustrating a usage state of an inspection socket provided with a contact probe according to a second embodiment of the present invention, in which FIG. 7A is a vertical sectional view thereof, and FIG. 7B is a cross-sectional view taken along d-d in FIG. 7A.

FIGS. 8A and 8B are views illustrating a usage state of an inspection socket provided with a contact probe according to a third embodiment of the present invention, in which FIG. 8A is a vertical sectional view there, and FIG. 8B is a cross-sectional view taken along e-e in FIG. 7A.

DETAILED DESCRIPTION OF EMBODIMENTS

First Embodiment

Hereinafter, the first embodiment of the present invention will be described with reference to the drawings.

First, the structure will be described.

Figure 1A:
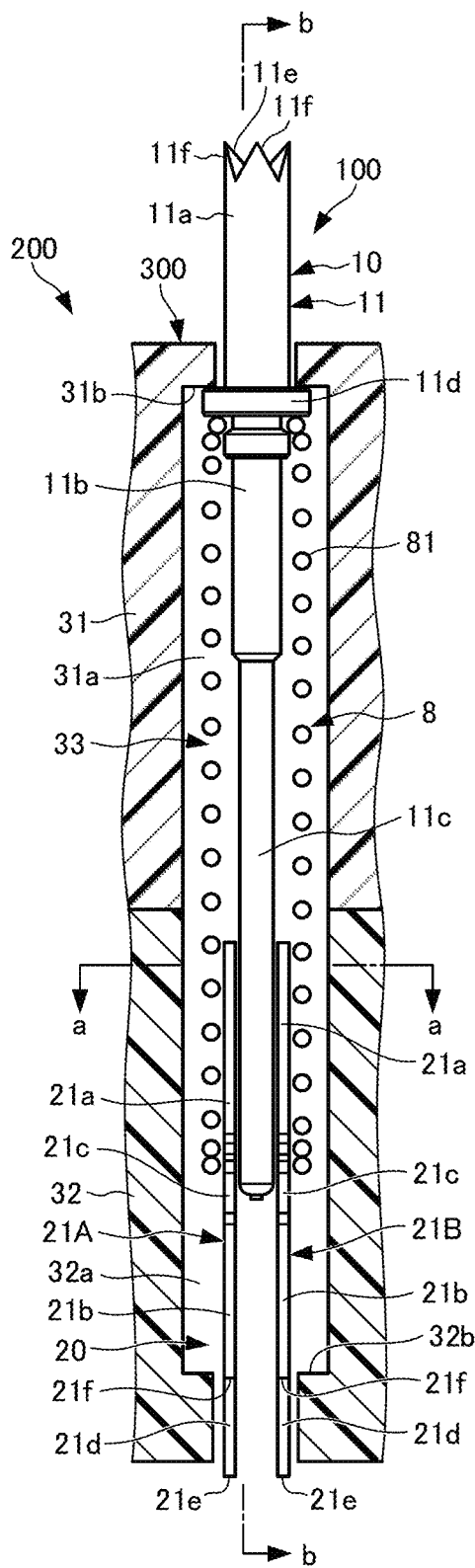
Figure 1B:
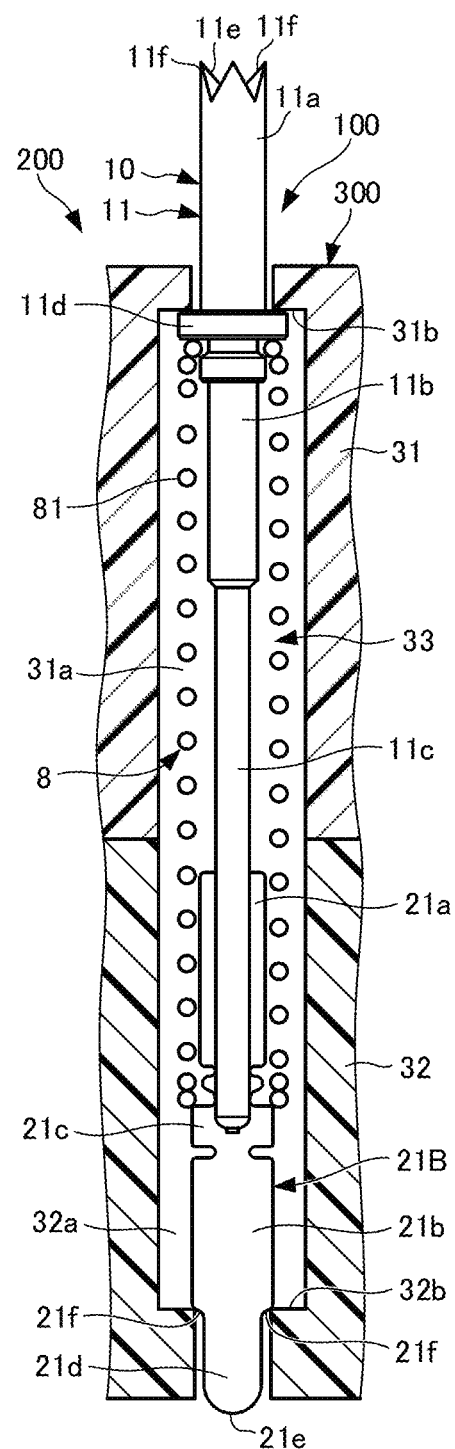
Figure 2:
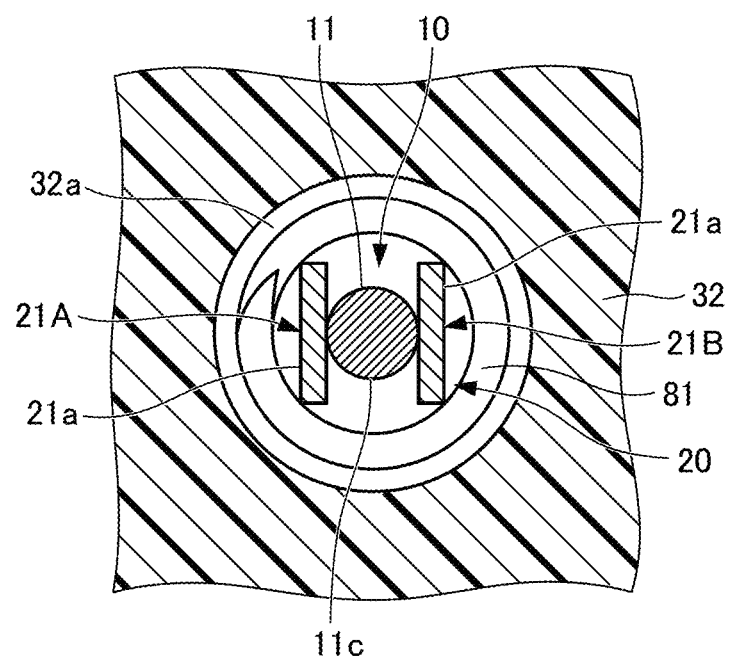
FIG. 2 is a cross-sectional view taken along a-a in FIG. 1A.
Figure 3:
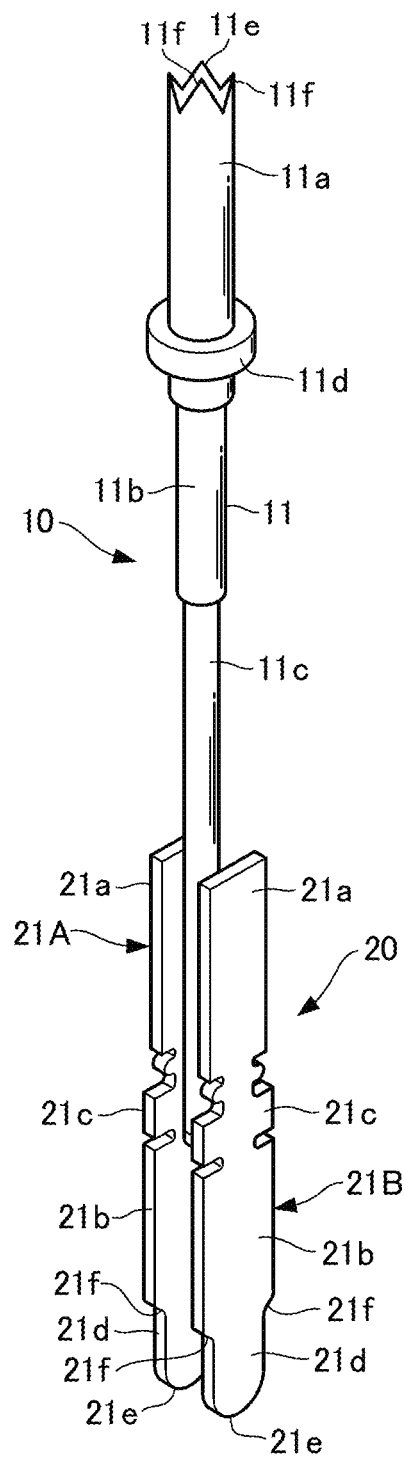
FIG. 3 is a perspective view illustrating a first contact terminal and a second contact terminal constituting the contact probe according to the first embodiment of the present invention.

FIGS. 1A and 1B illustrate an inspection socket 200 provided with a contact probe 100 according to the first embodiment. In addition, FIG. 2 illustrates a cross section taken along a-a in FIG. 1A. FIG. 3 illustrates a first contact terminal 10 and a second contact terminal 20 constituting the contact probe 100 according to the first embodiment.

Further, FIGS. 4A and 4B illustrate a state in which the inspection socket 200 according to the first embodiment is used. In other words, FIGS. 4A and 4B illustrate a state in which a solder ball 5 of a device under test 4 and a land 7 of a printed substrate 6 are electrically connected by the contact probe 100 according to the first embodiment to inspect the electrical characteristics of the device under test 4. Here, the solder ball 5 constitutes the first electrode in the present invention, and the land 7 constitutes the second electrode in the present invention. Further, the device under test 4 to be inspected is a semiconductor integrated circuit or the like.

As illustrated in FIGS. 4A and 4B, the device under test 4 is arranged above the inspection socket 200, and the solder ball 5 is formed on the surface of the device under test 4 facing the inspection socket 200. Further, the printed substrate 6 is arranged below the inspection socket 200 in FIGS. 4A and 4B, and the land 7 is formed so as to face the inspection socket 200 of the printed substrate 6. Wiring from a current supply circuit, a voltage measurement circuit, or the like (not illustrated) is connected to the printed substrate 6.

As illustrated in FIGS. 1A and 1B, the inspection socket 200 according to the first embodiment includes a contact probe 100 and a housing 300 in which an accommodation portion 33 that accommodates the contact probe 100 is formed. Although only one contact probe 100 is illustrated in FIGS. 1A and 1B, the inspection socket 200 may have a configuration in which a plurality of contact probes 100 are supported in a common housing 300.

As illustrated in FIGS. 1A and 1B, the housing 300 has a first housing portion 31 and a second housing portion 32 formed by an electrically insulating material. The first housing portion 31 and the second housing portion 32 are fixed with screws not illustrated. As illustrated in FIGS. 4A and 4B, the first housing portion 31 is arranged on the device under test 4 side, and the second housing portion 32 is arranged on the printed substrate 6 side. The first housing portion 31 has formed therein a through hole 31a extending in the direction from the device under test 4 toward the printed substrate 6 in FIGS. 4A and 4B, and the second housing portion 32 is formed with a through hole 32a concentric with the through hole 31a of the portion 31. The housing 300 is formed with the accommodation portion 33 in which the contact probe 100 is accommodated with the through holes 31a and 32a. Further, an annular protruded portion 31b is formed on the outer side of the through hole 31a of the first housing portion 31, that is, on the edge of the opening on the object to be inspected 4 side, and penetrates the second housing portion 32. An annular protrusion portion 32b is formed on the outer side of the through hole 32a, that is, on the edge of the opening on the printed substrate 6 side.

Next, the detailed configuration of the contact probe 100 according to the first embodiment will be described. As illustrated in FIGS. 1A and 1B, the contact probe 100 according to the first embodiment comprises: a first contact terminal 10 in contact with a solder ball 5 of a device under test 4; a second contact probe 20 in contact with a land 7 of a printed substrate 6; and an elastic body 8 that engages the first contact terminal 10 and the second contact terminal 20, and urges the first contact terminal 10 and the second contact terminal 20 to separate each other.

As illustrated in FIGS. 1A, 1B and 3, the first contact terminal 10 is formed by a rod-shaped metal member and is constituted by one first contact element 11 provided with a first contact portion 11e that comes into contact with the solder ball 5 of the device under test 4. The first contact element 11 has a large diameter portion 11a, a medium diameter portion 11b with a smaller diameter than the large diameter portion, and a small diameter portion 11c with a smaller diameter than the medium diameter portion from the top to the bottom in FIGS. 1A, 1B and 3, that is, from the inspected object 4 to the printed substrate 6 in FIGS. 4A and 4B. Further, the first contact element 11 has a flange portion 11d between the large diameter portion 11a and the medium diameter portion 11b. The large diameter portion 11a, the medium diameter portion 11b, the small diameter portion 11c, and the flange portion 11d are formed concentrically. Further, the large diameter portion 11a and the medium diameter portion 11b have substantially the same length, and the small diameter portion 11c has a length slightly longer than the total length of the large diameter portion 11a and the medium diameter portion 11b combined.

The first contact element 11 has a first contact portion 11e that comes into contact with the solder ball 5 at the tip of the large diameter portion 11a. The first contact portion 11e has a plurality of sharp protrusions 11f formed in the circumferential direction, and the first contact portion 11e is so configured that the solder ball 5 that contacts the inside of these protrusions 11f. The first contact element 11 is housed in the accommodation portion 33 of the housing 300 so that the flange portion 11d can engage with the protruded portion 31b and can move along the direction that the accommodation portion 33 extends.

As illustrated in FIGS. 1A to 4B, the second contact terminal 20 is constituted by a pair, that is, two second contact elements 21A and 21B having the same configuration. Each of the second contact elements 21A and 21B is formed by a flat metal plate, is provided with a second contact portion 21e that comes in contact with the land 7 of the printed substrate 6, and is so configured to clamp the first contact element 11 in a state of frictional contact with the first contact element 11. These second contact elements 21A and 21B are arranged in the accommodation portion 33 of the housing 300, so as to clamp the small diameter portion 11c of the first contact element 11.

As illustrated in FIGS. 1A, 1B and 3, each of the second contact elements 21A and 21B has a first plate portion 21a and a second plate portion 21b formed on the printed substrate 6 side of the first plate portion 21a and having a larger width than the first plate portion, and a spring engagement portion 21c having a width similar to that of the second plate portion 21b between the first plate portion 21a and the second plate portion 21b. Further, each of the second contact elements 21A and 21B has a tip plate portion 21d having a smaller width than the second plate portion 21b at the tip portion of the second plate portion 21b, a semi-arc-shaped second contact portion 21e formed at a tip of the tip plate portion 21d, and a step portion 21f formed on both side portions between the tip plate portion 21d and the second plate portion 21b.

As illustrated in FIGS. 1A, 1B and 2, the second contact elements 21A and 21B are arranged in the accommodation portion 33 in the housing 300, so that the first plate portion 21a is directed toward the side of the first housing portion 31, the second contact elements 21A and 21B are parallel with each other clamping the first contact element 11, and a portion extending from the first plate portion 21a to the spring engaging portion 21c is arranged so as to clamp a tip side portion of the small diameter portion 11c in the first contact element 11. Further, the second contact elements 21A and 21B are accommodated in the accommodation portion 33, so that the step portion 21f can engage with the protrusion portion 32b and can move along the direction that the accommodation portion 33 extends. As illustrated in FIG. 2, in the contact probe 100 according to the first embodiment, the small diameter portion 11c of the first contact element 11 comes into contact with a central portion of the second contact elements 21A and 21B in the width direction.

In the state of use of the inspection socket 200 as illustrated in FIGS. 4A and 4B, the first contact element 11 and the second contact elements 21A and 21B are so configured to be able to move in frictional contact with each other, so as to relatively approach and separate from the solder ball 5 of the device under test 4 and the land 7 of the printed substrate 6.

As illustrated in FIGS. 1A and 1B, the elastic body 8 according to the first embodiment is constituted by a coil spring 81 adapted to elastically push the first contact portion 11e of the first contact element 11 against the solder ball 5 of the device under test 4, and elastically push each of the second contact portions 21e of the second contact elements 21A and 21B against the land 7 of the printed substrate 6. The coil spring 81 has a form in which the pitches of the wound wires are separated by approximately equal pitches.

In the contact probe 100 according to the first embodiment, the first contact element 11 and the second contact elements 21A and 21B are conducted by the coil spring 81. By this configuration, the contact probe 100 according to the first embodiment is so configured such that the solder ball 5 of the device under test 4 with which the first contact portion 11e of the first contact element 11 comes into contact, and the land 7 of the printed substrate 6 with which each of the second contact portions 21e of the second contact elements 21A and 21B comes into contact are conducted.

As illustrated in FIGS. 1A and 1B, the coil spring 81, in its compressed state, is engaged with the flange portion 11d of the first contact element 11 at one end, and is engaged with each of the spring engagement portions 21c of the second contact elements 21A and 21B at the other end. By this configuration, the coil spring 81 is so adapted to surround most of the first contact element 11 ranging from the medium diameter portion 11b to the small diameter portion 11c and the first plate portion 21a of each of the second contact elements 21A and 21B. As illustrated in FIGS. 4A and 4B, the first contact element 11 is so adapted that, by the urging force of the coil spring 81, the flange portion 11d engages with the inner surface of the protruded portion 31b of the first housing portion 31, and the large diameter portion 11a protrudes from the first housing portion 31 toward the device under test 4. Further, the second contact elements 21A and 21B, are so adapted that each step portion 21f engages with the inner edge of the protrusion portion 32b, and the second contact portion 21e protrudes from the second housing portion 32 toward the printed substrate 6.

Next, the operation will be described.

In the contact probe 100 of the inspection socket 200 according to the first embodiment configured as described above, the second contact terminal 20 is Ruined by a flat metal plate, and is constituted by the two second contact elements 21A and 21B that clamp the first contact element 11 of the first contact terminal 10. Therefore, when manufacturing the second contact elements 21A and 21B, drilling is not required unlike the conventional second contact terminal having a cylindrical portion. Therefore, the contact probe according to the present invention can be easily manufactured using processing technologies, for example, press processing, etching processing and the like with a relatively low manufacturing cost, and as a result the contact probe 100 according to the present invention can be easily mass-produced and the manufacturing cost can be reduced. Further, in the contact probe 100 according to the first embodiment, since the second contact terminal 20 is formed by the two second contact elements 21A and 21B, the second contact terminal 20 has a simple structure. From this point as well, the contact probe can be easily mass-produced and manufacturing costs can be reduced.

Further, since the second contact terminal 20 of the contact probe 100 according to the first embodiment has two second contact elements 21A and 21B, the second contact terminal 20 has two contact portions 21e that comes into contact with the land 7 of the printed substrate 6. For this reason, even though, for example, an insulating foreign matter is caught between the second contact portion 21e of one of the second contact elements 21A and the land 7, and, due to this, the second contact portion 21e comes into contact with the land 7 in an unstable state, and the other second contact portion 21e of the second contact element 21B, can be reliably contacted with the land 7, thereby making it possible to obtain a stable contact state with the land 7.

Next, modification examples of the first embodiment will be described.

In the modification examples described below, the second contact element constituting the second contact terminal 20 in the first embodiment described above is different from that of the first embodiment described above, and therefore, in the following description, the same components as those of the first embodiment described above are designated by the same reference numerals, and only the differences from the first embodiment described above will be described.

Modification Example 1

Modification Example 1 will be described with reference to FIG. 5. The second contact terminal 20 in the first embodiment described above is constituted by two second contact elements 21A and 21B made of a flat metal plate, but the second contact terminal 20 of the modification example 1 is constituted by three second contact elements 21A, 21B, 21C formed by a flat metal plate arranged so as to surround and clamp the first contact element 11. The second contact element 21C has the same configuration as the second contact elements 21A and 21B. This means that the second contact terminal 20 of the modification example 1 is configured by adding the second contact element 21C to the second contact terminal 20 of the first embodiment described above.

Figure 5:
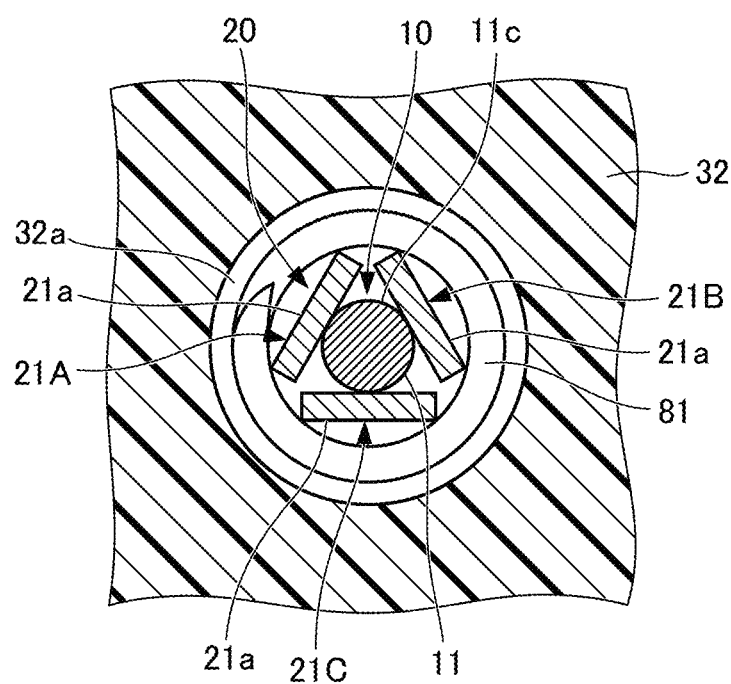
FIG. 5 is a view illustrating a modification example 1 of the contact probe according to the first embodiment of the present invention, and is a cross-sectional view corresponding to a portion a-a of FIG. 1A.

As illustrated in FIG. 5, in the modification example 1, the three second contact elements 21A, 21B, and 21C are arranged to form an equilateral triangular shape in a plan view, so that the small diameter portion 11c of the first contact element 11 comes into contact with a central portion in width direction of the second contact elements 21A, 21B, 21C.

In the modification example 1, the first contact element 11 is surrounded and clamped by the three second contact elements 21A, 21B, and 21C constituting the second contact terminal 20, so that the first contact element 11 can be reliably and stably supported in a predetermined position without causing blurring.

The second contact terminal 20 according to the above-described modification example 1 is constituted by three second contact elements 21A, 21B, and 21C respectively formed by a flat metal plate, however, the second contact terminal the contact probe according to the present invention may be configured to surround and clamp the first contact element 11 by a second contact element constituted by four or more flat metal plates.

Modification Example 2

Modification example 2 will be described with reference to FIG. 6. The second contact terminal 20 in the modification example 2 has a concave cross-sectional shape on the inner surface, and is formed by two second contact elements 23A and 23B arranged so as to surround and clamp the first contact element 11. The second contact elements 23A and 23B of the modification example 2 are formed by bending the second contact element 21A of the first embodiment described above with the center line in the width direction as a bending line at an angle close to a right angle, so that the cross section has a mountain shape. This means that the second contact elements 23A and 23B of the modification example 2, similar to the second contact element 21A of the first embodiment described above, has, although not illustrated, the first plate portion 21a, the second plate portion 21b, the spring engagement portion 21c, the tip plate portion 21d, and the step portion 21f, and has the second contact portion 21e in contact with the land 7 of the printed substrate 6 at the tip thereof.

Figure 6:
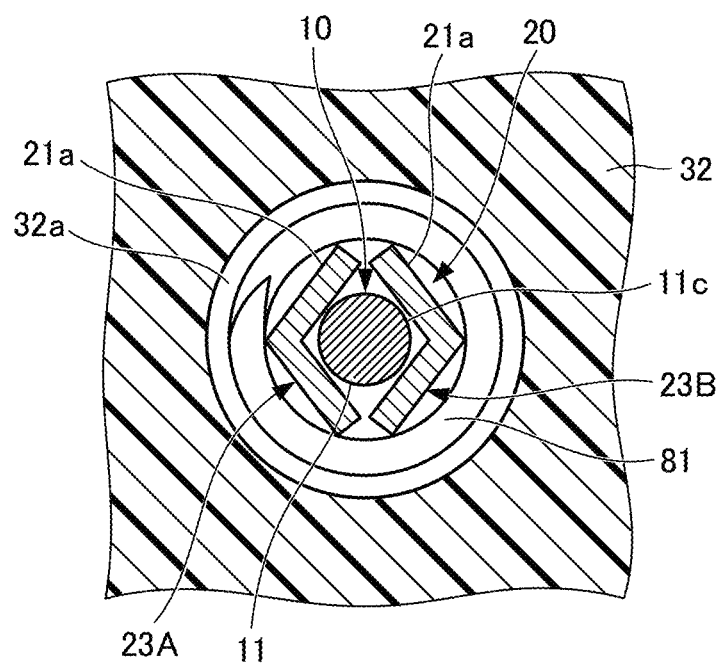
FIG. 6 is a view illustrating a modification example 2 of the contact probe according to the first embodiment of the present invention, and is a cross-sectional view corresponding to a portion a-a of FIG. 1A.

As illustrated in FIG. 6, in the modification example 2, the two second contact elements 23A and 23B are arranged so as to surround and clamp the first contact element 11 with the inner surfaces of the valley side facing each other. Further, the second contact elements 23A and 23B are respectively so configured that an apex portion of a bent portion on an outer surface side and both side edges on the outer surface side come into contact with an inner peripheral surface of the coil spring 81.

In the modification example 2, the first contact element 11 is surrounded and clamped by the two second contact elements 23A and 23B having a concave cross-sectional shape on the inner surface, so that the first contact element 11 can be reliably and stably supported in a predetermined position without causing blurring.

The second contact elements 23A and 23B according to the above-described modification example 2 have a mountain-shaped cross-sectional shape, but the second contact element having a concave cross-sectional shape on the inner surface according to the present invention is not limited to the mountain-shaped cross-sectional shape, and any cross-sectional shape may be used as long as the inner surface clamping at least the first contact element has a concave cross-sectional shape.

Second Embodiment

Next, the second embodiment will be described with reference to FIG. 7.

Since the second embodiment is an embodiment in which the shape of the coil spring 81 was changed from the shape of the coil spring 81 of the first embodiment described above and all other configuration is the same, the components are designated by the same reference numerals, and only the differences from the above-described first embodiment will be described.

Figure 7A:
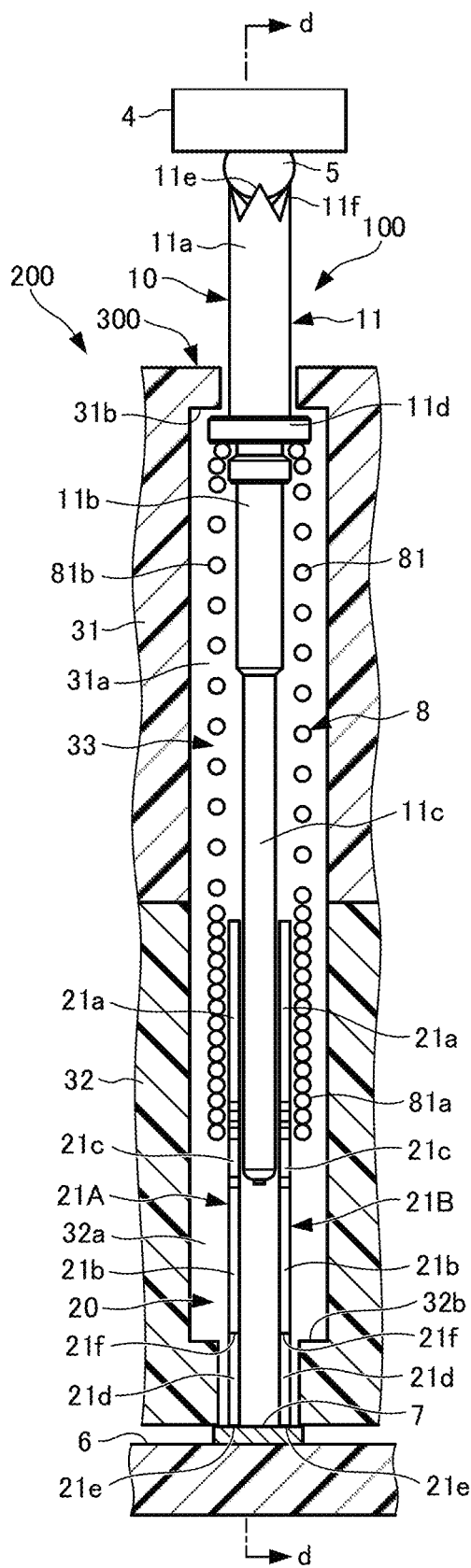
Figure 7B:
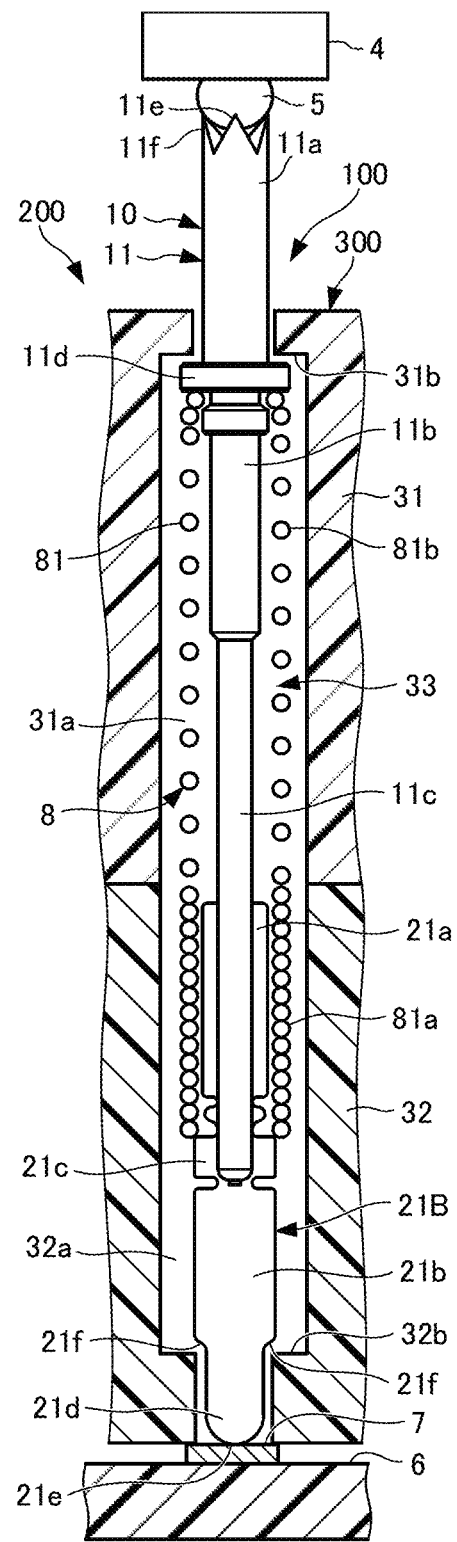

In the coil spring 81 according to the first embodiment described above, the wound wires are separated from each other at substantially equal pitches, but as illustrated in FIG. 7, the coil spring 81 according to the second embodiment has a closely wound portion 81a in which the wire rod is wound in close contact, and a sparsely wound portion 81b in which the wire rod is wound at a sparser pitch than the closely wound portion 81a. The sparsely wound portion 81b is provided around the portion of the first contact element 11 that is not clamped between the second contact elements 21A and 21B, while the closely wound portion 81a is provided around the first plate portion 21a of each of the second contact elements 21A and 21B, so that the closely wound portion 81a of the coil spring 81 surrounds the portion of the first contact element 11 by which the second contact elements 21A and 21B clamp the small diameter portion 11c of the first contact element 11. The second contact terminal 20 according to the second embodiment is arranged so that the side edges of the second contact elements 21A and 21B on the outer surface side come into contact with the inner peripheral surface of the closely wound portion 81a of the coil spring 81.

The contact probe 100 according to the second embodiment is so configured that the closely wound portion 81a having stronger elasticity than the sparsely wound portion 81b of the coil spring 81 surrounds the portion that the two second contact elements 21A and 21B clamp the first contact element 11. Because of this, in the contact probe 100 according to the second embodiment, the first contact element 11 and the second contact elements 21A and 21B are less likely to be separated from each other, so that a sure state of frictional contact between the first contact element 11 and the second contact elements 21A, 21B, and the inclination of the first contact element 11 can be suppressed by the closely wound portion 81a.

The coil spring 81 according to the second embodiment has a closely wound portion 81a and a sparsely wound portion 81b integrally configured, but the coil spring 81 may have a two-body configuration, including a closely wound spring in place of the closely wound portion 81a and a sparsely wound spring in place of the sparsely wound portion 81b.

Third Embodiment

Next, the third embodiment of the present invention will be described with reference to FIGS. 8A to 12.

The third embodiment described below is an embodiment in which the contact targets of the first contact terminal 10 and the second contact terminal 20 in the contact probe 100 according to the first and second embodiments described above are reversed. Therefore, in the following description, the same components as those in the first and second embodiments described above are designated by the same reference numerals, and only the differences from the first and second embodiments described above will be described.

Figure 8A:
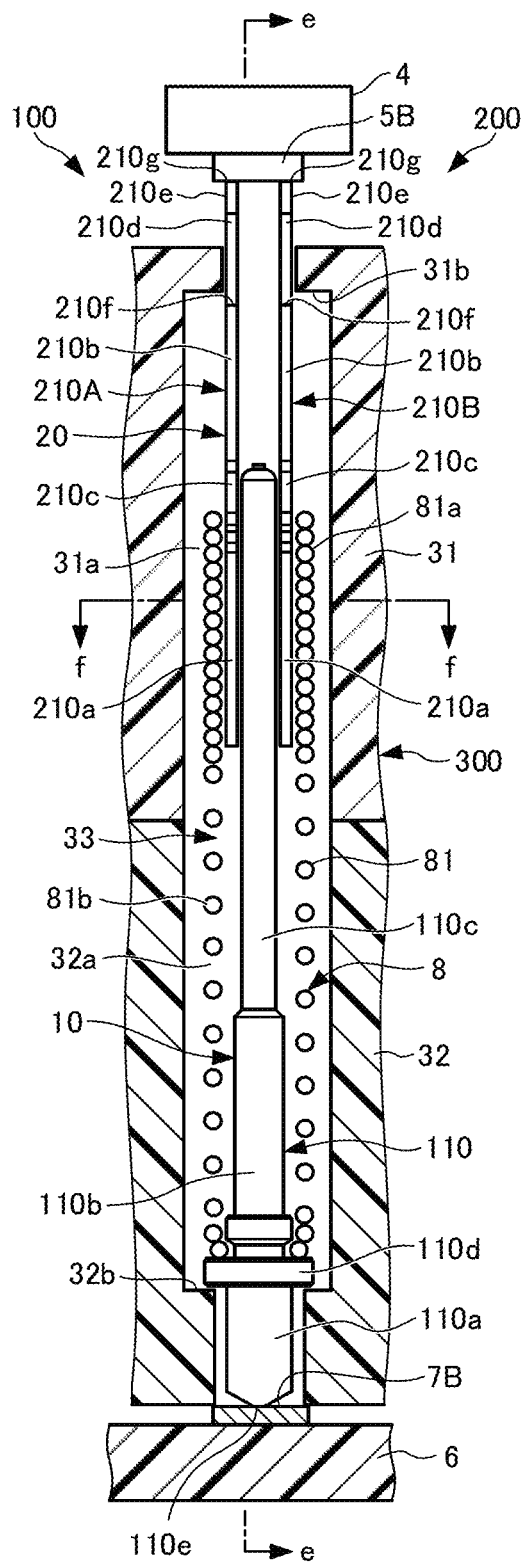
Figure 8B:
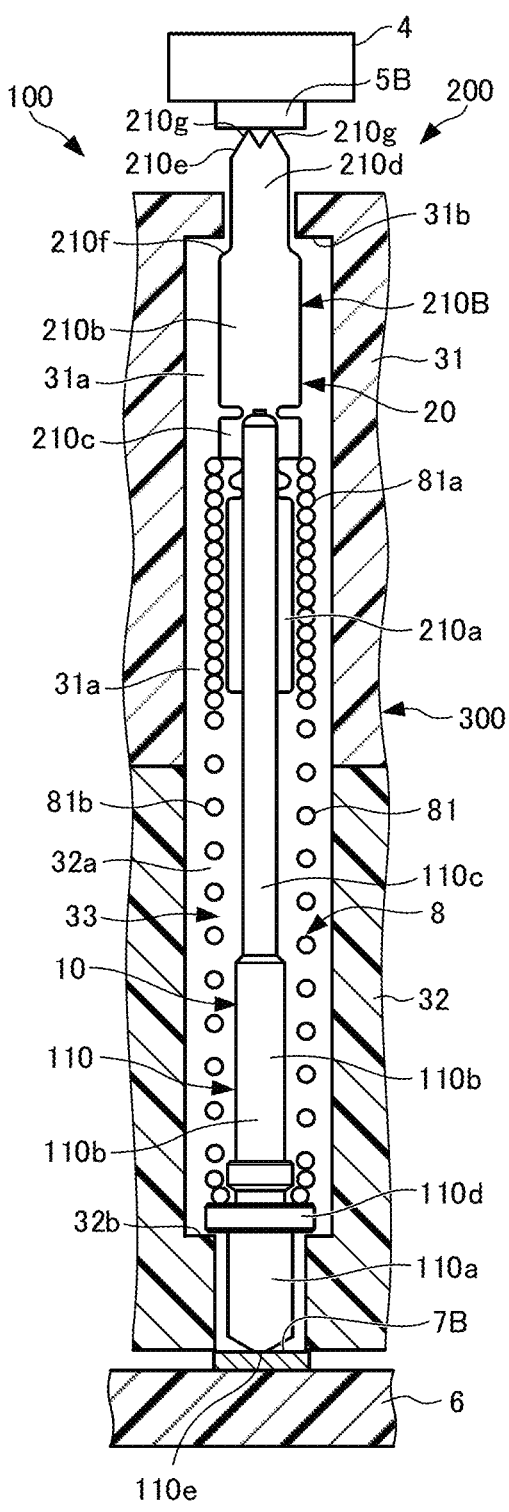
Figure 9:
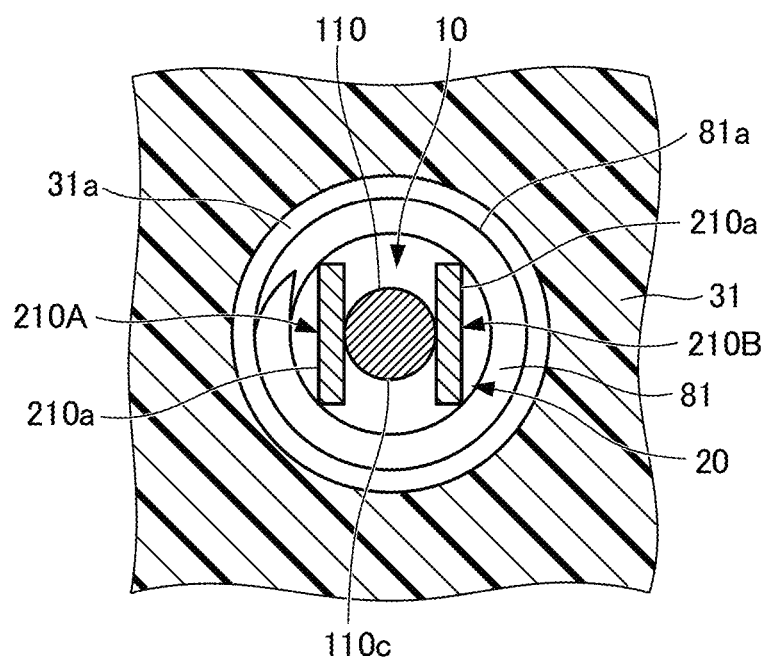
FIG. 9 is a cross-sectional view taken along f-f in FIG. 8A.

FIGS. 8A and 8B illustrate the inspection socket 200 provided with the contact probe 100 according to the third embodiment. Further, FIG. 9 illustrates the cross section taken along f-f in FIG. 8A, and FIG. 10 illustrates the first contact terminal 10 and the second contact terminal 20 constituting the contact probe 100 according to the third embodiment.

In the third embodiment, the device under test 4 is provided with a plate-shaped electrode pad 5B instead of the solder ball 5 in the first and second embodiments described above. Further, the printed substrate 6 is provided with a land 7B as in the first and second embodiments. In the contact probe 100 according to the first and second embodiments described above, the first contact terminal 10 is configured to come into contact with the solder ball 5 of the device under test 4, and the second contact terminal 20 is configured to come into contact with the land 7 of the printed substrate 6. However. in the contact probe 100 according to the third embodiment, the first contact terminal 10 is configured to come into contact with the land 7B of the printed substrate 6, and the second contact terminal 20 is configured to come into contact with the electrode pad 5B of the device under test 4. In the third embodiment, the land 7B constitutes the first electrode in the present invention, and the electrode pad 5B constitutes the second electrode of the present invention.

Figure 10:
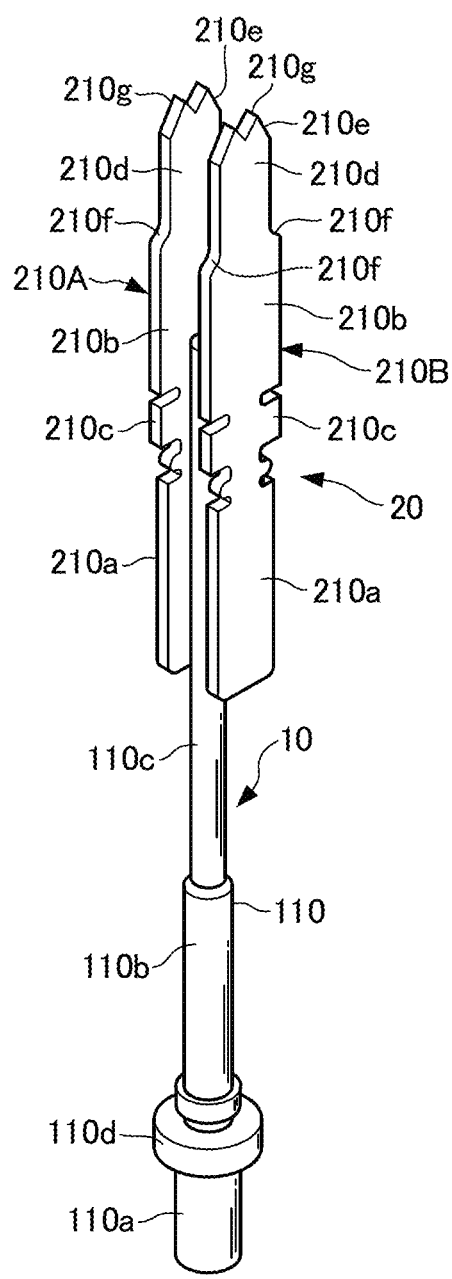
FIG. 10 is a perspective view illustrating a first contact terminal and a second contact terminal constituting the contact probe according to the third embodiment of the present invention.

As illustrated in FIGS. 8A, 8B and 10, the first contact terminal 10 according to the third embodiment is formed by a rod-shaped metal member, and is constituted by one first contact element 110 provided with a first contact portion 110e that comes into contact with the land 7B of the printed substrate 6. The first contact element 110 has a large diameter portion 110a, a medium diameter portion 110b having a smaller diameter than the large diameter portion 110a, and a small diameter portion having a smaller diameter than the medium diameter portion 110b, in the direction from the printed substrate 6 toward the device under test 4. Further, the first contact element 110 has a flange portion 110d between the large diameter portion 110a and the medium diameter portion 110b. The large diameter portion 110a, the medium diameter portion 110b, the small diameter portion 110c, and the flange portion 110d are formed concentrically. Further, the medium diameter portion 110b has a length of about twice that of the large diameter portion 110a, and the small diameter portion 110c has a length slightly longer than the total length of the large diameter portion 110a and the medium diameter portion 110b combined.

The first contact element 110 has a first contact portion 110e in contact with the land 7B at the tip of the large diameter portion 110a. As illustrated in FIGS. 8A and 8B, the tip of the large diameter portion 110a on the land 7B side is formed in a conical shape, and a first contact portion 110e is formed at the tip thereof. The first contact element 110 is accommodated in the accommodation portion 33 of the housing 300 so that the flange portion 110d can engage with the protrusion portion 32b and can move along the direction that the accommodation portion 33 extends.

As illustrated in FIGS. 8A, 8B, and 10, the second contact terminal 20 according to the third embodiment is constituted by a pair, that is, two second contact elements 210A and 210B having the same configuration. Each of the second contact elements 210A and 210B is formed by a flat metal plate, and is provided with a second contact portion 210e that comes into contact with the electrode pad 5B of the device under test 4, and is so configured to clamp the first contact element 110 in a state of frictional contact with a part of the first contact element 110. These second contact elements 210A and 210B are arranged in the accommodation portion 33 of the housing 300 so as to clamp the small diameter portion 110c of the first contact element 110.

As illustrated in FIGS. 8A, 8B, and 10, each of the second contact elements 210A and 210B has a first plate portion 210a and a second plate portion 210b wider than that of the first plate portion 210a and formed on the device under test 4 side of the first plate portion 210a, and further has a spring engagement portion 210c having a width similar to that of the second plate portion 210b between the first plate portion 210a and the second plate portion 210b. Further, each of the second contact elements 210A and 210B has: a tip plate portion 210d having a width smaller than that of the second plate portion 210b at the tip portion of the second plate portion 210b; a second contact portion 201e formed at the tip of the tip plate portion; and a step portion 210f formed between the tip plate portion 210d and the second plate portion 210b. The second contact portion 210e has two sharp protrusions 210g, and the second contact portion 210e is so configured that the electrode pad 5B is in contact with these protrusions 210g.

As illustrated in FIGS. 8A, and 8B, the second contact elements 210A and 210B are arranged in the accommodation portion 33 in the housing 300, so that the first plate portion 210a is directed toward the side of the second housing portion 32, the second contact elements 210A and 210B are parallel with each other clamping the first contact portion 110, and a portion extending from the first plate portion 210a to the spring engaging portion 210c is arranged so as to clamp a tip side portion of the small diameter portion 110c in the first contact element 110. Further, the second contact elements 210A and 210B are accommodated in the accommodation portion 33, so that the step portion 210f can engage with the protrusion portion 31b and can move along the direction that the accommodation portion 33 extends. As illustrated in FIG. 9, in the contact probe 100 according to the third embodiment, the small diameter portion 110c of the first contact element 110 comes into contact with a central portion of the second contact elements 210A and 210B in the width direction.

In the state of use of the inspection socket 200 illustrated in FIGS. 8A and 8B, the first contact element 110 and the second contact elements 210A and 210B according to the third embodiment are so configured to be able to move in frictional contact with each other, so as to relatively approach and separate from the land 7B of the printed substrate 6 and the electrode pad 5B of the device under test 4.

As illustrated in FIGS. 8A and 8B, the coil spring 81 constituting the elastic body 8 according to the third embodiment is adapted to elastically push the first contact portion 11e of the first contact element 11 against the land 7B of the printed substrate 6, and elastically push each of the second contact portions 210e of the second contact elements 210A and 210B against the electrode pad 5B of the device under test 4.

In the contact probe 100 according to the third embodiment, the first contact element 11 and the second contact elements 21A and 21B are conducted by the coil spring 81. By this configuration, the contact probe 100 according to the third embodiment is so configured that the land 7 of the printed substrate 6 with which the first contact portion 110e of the first contact element 110 comes into contact, and the electrode pad 5B of the device under test 4 with which each of the second contact portions 210e of the second contact elements 210A and 210B comes into contact are conducted.

As illustrated in FIGS. 8A and 8B, the coil spring 81, in its compressed state, is engaged with the flange portion 110d of the first contact element 110 by its one end, and is engaged with each of the spring engagement portions 210c of the second contact elements 210A and 210B at the other end. By this configuration, the coil spring 81 is so adapted to surround most of the first contact element 110 ranging from the medium diameter portion 110b to the small diameter portion 110c and the first plate portion 210a of each of the second contact elements 210A and 210B.

As illustrated in FIGS. 8A and 8B, the coil spring 81 according to the third embodiment has, similar to the second embodiment, a closely wound portion 81a in which the wire rod is wound in close contact, and a sparsely wound portion 81b in which the wire rod is wound at a sparser pitch than the closely wound portion 81a. In the third embodiment, the sparsely wound portion 81b is provided around the portion of the first contact element 110 that is not clamped between the second contact elements 210A and 210B, and the tightly wound portion 81a is provided around each first plate portion 210a of the second contact elements 210A, 210B. As illustrated in FIG. 9, the second contact terminal 20 according to the third embodiment is so arranged that side edges on the outer surface side of the second contact elements 210A and 210B comes in contact with the inner peripheral surface of the tightly wound portion 81a of the coil spring 81.

The coil spring 81 has a closely wound portion 81a and a sparsely wound portion 81b integrally configured, but the coil spring 81 may have a two-body configuration, including a closely wound spring in place of the closely wound portion 81a and a sparsely wound spring in place of the sparsely wound portion 81b.

Next, the operation will be described.

In the contact probe 100 of the inspection socket 200 according to the third embodiment described above, the second contact terminal 20 is foamed by a flat metal plate, and is constituted by the two second contact elements 210A and 210B that clamp the first contact element 110 of the first contact terminal 10. Therefore, when manufacturing the second contact elements 210A and 210B, drilling is not required unlike the conventional second contact terminal having a cylindrical portion. Therefore, the contact probe according to the present invention can be easily manufactured using processing technologies, for example, press processing, etching processing and the like with a relatively low manufacturing cost, and as a result, the contact probe 100 according to the third embodiment can be easily mass-produced and the manufacturing cost can be reduced. Further, in the contact probe 100 according to the third embodiment, since the second contact terminal 20 is formed by the two second contact elements 210A and 210B, the second contact terminal 20 has a simple structure. From this point as well, the contact probe can be easily mass-produced and manufacturing costs can be reduced.

Further, since the second contact tear final 20 of the contact probe 100 according to the third embodiment has two second contact elements 210A and 210B, the second contact terminal 20 has two contact portions 210e that come into contact with the electrode pad 5B of the inspected body 4. For this reason, even though, for example, an insulating foreign matter is caught between the second contact portion 210e of one of the second contact elements 210A and the electrode pad 5B, and, due to this, the second contact portion 210e comes into contact with the electrode pad 5B in an unstable state, the other second contact portion 210e of the second contact element 210B, can be reliably contacted with the electrode pad 5B, thereby making it possible to obtain a stable contact state with the electrode pad 5B.

Further, the contact probe 100 is so configured that the tightly wound portion 81a having a stronger elasticity than the sparsely wound portion 81b in the coil spring 81 surrounds the portion where the contact element 110 is clamped by the two second contact elements 210A, 210B. Because of this, in the contact probe 100 according to the third embodiment, the first contact element 110 and the second contact elements 210A and 210B are less likely to be separated from each other, so that a sure state of frictional contact between the first contact element 110 and the second contact elements 210A, 210B, and the inclination of the first contact element 110 can be suppressed by the closely wound portion 81a.

Modification Example

Figure 11:
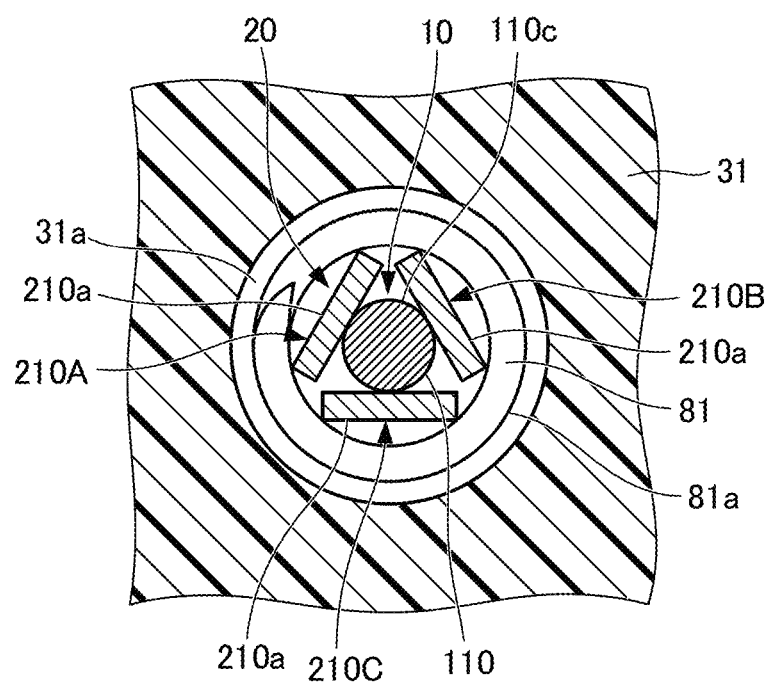
FIG. 11 is a view illustrating a modification example of the contact probe according to the third embodiment of the present invention, and is a cross-sectional view corresponding to the f-f portion of FIG. 8A.

Also in the third embodiment, the above-described modification examples 1 and 2 of the first embodiment can be applied in the same manner. This means that, as illustrated in FIG. 11, the third embodiment can be so configured that the small diameter portion 110c of the first contact element 110 is clamped by the three second contact elements 210A, 210B, and 210C constituted by flat metal plates arranged to form an equilateral triangular shape in a plan view. The second contact element 210C has the same configuration as the second contact elements 210A and 210B.

In the modification example illustrated in FIG. 11, since the first contact element 110 is surrounded and clamped by the three second contact elements 210A, 210B, 210C constituting the second contact terminal 20, the first contact element 110 can be reliably and stably supported in a predetermined position without causing blurring.

Figure 12:
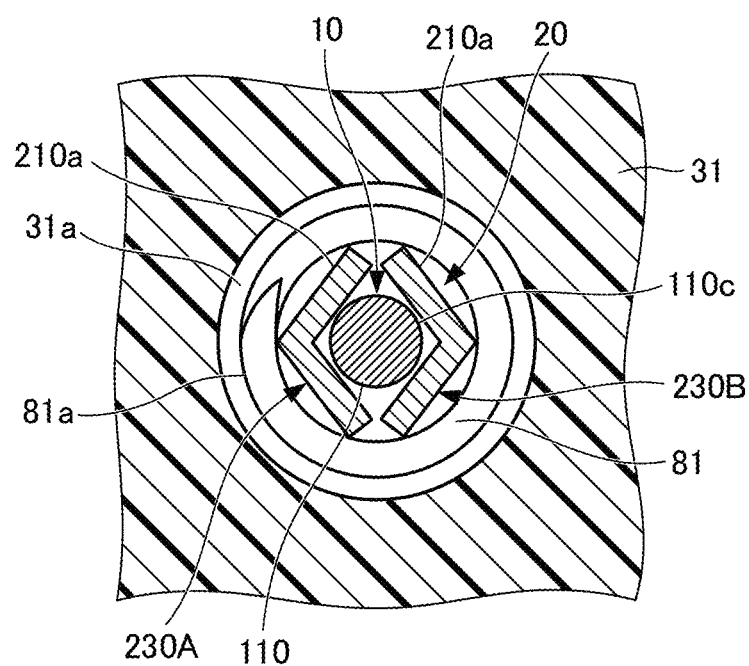
FIG. 12 is a view illustrating another modification example of the contact probe according to the third embodiment of the present invention, and is a cross-sectional view corresponding to the f-f portion of FIG. 8A.

Further, as illustrated in FIG. 12, the third embodiment can be so configured that the small diameter portion 110c of the first contact element 110 is clamped by the two second contact elements 230A and 230B having a mountain-shaped cross section and are arranged so that the inner surfaces of the valley side face each other. The second contact elements 230A and 230B are formed by bending the second contact element 210A of the third embodiment described above with the center line in the width direction as a bending line at an angle close to a right angle. While not shown, similar to the second contact element 210A the second contact elements 230A and 230B have a first plate portion 210a, a second plate portion 210b, a spring engaging portion 210c, a tip plate portion 210d, and a step portion 210f, and have the second contact portion 210e provided with two protrusions 210g that comes in contact with the electrode pad 5B of the device under test 4 at the tip thereof.

In the modification example illustrated in FIG. 12, since the first contact element 110 is surrounded and clamped by the two second contact elements 230A and 230B having a concave cross-sectional shape on the inner surface, the first contact element 110 can be reliably and stably supported in a predetermined position without causing blurring.

INDUSTRIAL APPLICABILITY

The contact probe according to the present invention and the inspection socket provided with the same can be easily mass-produced and can reduce the manufacturing cost, while being able to obtain a stable contact state with an electrode such as a land of an inspection substrate, and therefore are useful as a contact probe for use in inspection of electrical characteristics of a semiconductor integrated circuit and the like and as an inspection socket provided with the same.

EXPLANATION OF REFERENCE NUMERALS

5 Solder Ball (First Electrode)
5B Electrode Pad (Second Electrode)
7 Land (Second Electrode)
7B Land (First Electrode)
8 Elastic Body
10 First Contact Terminal
11 First Contact Element
11e First Contact Portion
20 Second Contact Terminal
21A, 12B, 21C, 23A, 23B Second Contact Element
21e Second Contact Portion
33 Accommodation Portion
81 Coil Spring
81a Closely Wound Portion
81b Sparsely Wound Portion
100 Contact Probe
110 First Contact Element
200 Inspection Socket
210A, 210B, 210C, 230A, 230B Second Contact Element
300 Housing

What is claimed is:

1. A contact probe to electrically connect a first electrode to a second electrode, the first electrode being in a form of a solder ball, the contact probe comprising:
   a first contact terminal that contacts the first electrode;
   a second contact terminal that contacts the second electrode; and
   an elastic body that engages the first contact terminal and the second contact terminal, and urges the first contact terminal and the second contact terminal so as to separate the first and the second terminals, wherein
   the first contact terminal is constituted by a first contact in a form of a rod-shaped metal member having a cross-section with a thickness substantially equal to a width thereof and provided with a first contact portion that contacts with the first electrode,
   the second contact terminal is constituted by a plurality of second contacts in a form of a plate-shaped metal member, provided with a second contact portion that contacts with the second electrode, and clamp the first contact in a frictional contact with a part of the first contact,
   the first contact and the second contact can move so as to be frictionally contacting each other while being relatively close to and spaced apart from the first electrode and the second electrode, and
   the elastic body is constituted by a coil spring provided so as to surround at least a part of the first contact and the second contact, to elastically press the first contact portion of the first contact against the first electrode, and to elastically press the second contact portion of the second contact against the second electrode.

2. The contact probe according to claim 1, wherein each of the second contacts of the second contact terminal has an inner surface concave cross-sectional shape, and the second contact terminal is constituted by a plurality of the second contacts arranged to surround and clamp the first contact.

3. The contact probe according to claim 1, wherein the coil spring has a closely wound portion in which a wire rod is wound in close contact and a sparsely wound portion in which the wire rod has a coarser pitch than and is wound apart compared to the closely wound portion, and
the closely wound portion is provided so as to surround a portion that clamps the first contact by the plurality of the second contacts.

4. An inspection socket provided with the contact probe according to claim 1, and a housing in which an accommodation portion that accommodates the contact probe is formed.

5. The contact probe according to claim 1, wherein the rod-shaped metal member is formed by a polygonal prism or a cylindrical member.

6. The contact probe according to claim 1, wherein each of the second contacts of the second contact terminal is in a form of a flat metal plate.

7. The contact probe according to claim 6, wherein the second contact terminal is constituted by two second contacts arranged to clamp the first contact.

8. The contact probe according to claim 6, wherein the second contact terminal is constituted by three or more second contacts arranged to surround and clamp the first contact.

9. A contact probe to electrically connect a first electrode to a second electrode, the contact probe comprising:
   a first contact terminal that contacts the first electrode;
   a second contact terminal that contacts the second electrode; and
   an elastic body that engages the first contact terminal and the second contact terminal, and urges the first contact terminal and the second contact terminal so as to separate the first and the second terminals, wherein
   the first contact terminal is constituted by a first contact, that is in a form of a rod-shaped metal member and provided with a first contact portion that contacts with the first electrode,
   the second contact terminal is constituted by a plurality of second contacts, that are in a form of a plate-shaped metal member, provided with a second contact portion that contacts with the second electrode, and clamp the first contact in a frictional contact with a part of the first contact, each of the second contacts of the second contact terminal being in a form of a flat metal plate, the second contact terminal being constituted by three or more second contacts arranged to surround and clamp the first contact,
   the first contact and the second contact can move so as to be frictionally contacting each other while being relatively close to and spaced apart from the first electrode and the second electrode, and
   the elastic body is constituted by a coil spring provided so as to surround at least a part of the first contact and the second contact, to elastically press the first contact portion of the first contact against the first electrode, and to elastically press the second contact portion of the second contact against the second electrode.

10. The contact probe according to claim 9, wherein the coil spring has a closely wound portion in which a wire rod is wound in close contact and a sparsely wound portion in which the wire rod has a coarser pitch than and is wound apart compared to the closely wound portion, and
the closely wound portion is provided so as to surround a portion that clamps the first contact by the plurality of the second contacts.

11. An inspection socket provided with the contact probe according to claim 9, and a housing in which an accommodation portion that accommodates the contact probe is formed.

12. A contact probe to electrically connect a first electrode to a second electrode, the contact probe comprising:
- a first contact terminal that contacts the first electrode;
- a second contact terminal that contacts the second electrode; and
- an elastic body that engages the first contact terminal and the second contact terminal, and urges the first contact terminal and the second contact terminal so as to separate the first and the second terminals, wherein
- the first contact terminal is constituted by a first contact, that is in a form of a rod-shaped metal member and provided with a first contact portion that contacts with the first electrode,
- the second contact terminal is constituted by a plurality of second contacts, that are in a form of a plate-shaped metal member, provided with a second contact portion that contacts with the second electrode, and clamp the first contact in a frictional contact with a part of the first contact, each of the second contacts of the second contact terminal having an inner surface concave cross-sectional shape, and the second contact terminal being constituted by a plurality of the second contacts arranged to surround and clamp the first contact,
- the first contact and the second contact can move so as to be frictionally contacting each other while being relatively close to and spaced apart from the first electrode and the second electrode, and
- the elastic body is constituted by a coil spring provided so as to surround at least a part of the first contact and the second contact, to elastically press the first contact portion of the first contact against the first electrode, and to elastically press the second contact portion of the second contact against the second electrode.

13. The contact probe according to claim 12, wherein
- the coil spring has a closely wound portion in which a wire rod is wound in close contact and a sparsely wound portion in which the wire rod has a coarser pitch than and is wound apart compared to the closely wound portion, and
- the closely wound portion is provided so as to surround a portion that clamps the first contact by the plurality of the second contacts.

14. An inspection socket provided with the contact probe according to claim 12, and a housing in which an accommodation portion that accommodates the contact probe is formed.

* * * * *